United States Patent [19]

Lemke

[11] 4,323,890
[45] Apr. 6, 1982

[54] SWITCHING CIRCUIT FOR MONITORING THE SWITCHING STATE OF SWITCH ELEMENTS

[75] Inventor: Andreas Lemke, Berlin, Fed. Rep. of Germany

[73] Assignee: Auergesellschaft GmbH, Berlin, Fed. Rep. of Germany

[21] Appl. No.: 146,309

[22] Filed: May 5, 1980

[30] Foreign Application Priority Data

May 22, 1979 [DE] Fed. Rep. of Germany ....... 2921095

[51] Int. Cl.³ .............................................. G08B 25/00
[52] U.S. Cl. ........................................ 340/524; 246/5
[58] Field of Search ..................... 340/504, 524; 246/5

[56] References Cited

FOREIGN PATENT DOCUMENTS 1489921 10/1977 United Kingdom .................... 246/5

Primary Examiner—Reinhard J. Eisenzopf
Attorney, Agent, or Firm—Brown, Flick & Peckham

[57] ABSTRACT

A switching circuit for monitoring the switching state of switching elements wherein the switching state of the switching element is detected and a corresponding signal is generated and this signal is compared to the input signal initially provided for switching the switching element from one switching state to another whereby a fault signal is produced when the switching state monitor signal indicates that the switching element is in one switching state and the input signal indicates that the switching element is or should be in another switching state.

6 Claims, 2 Drawing Figures

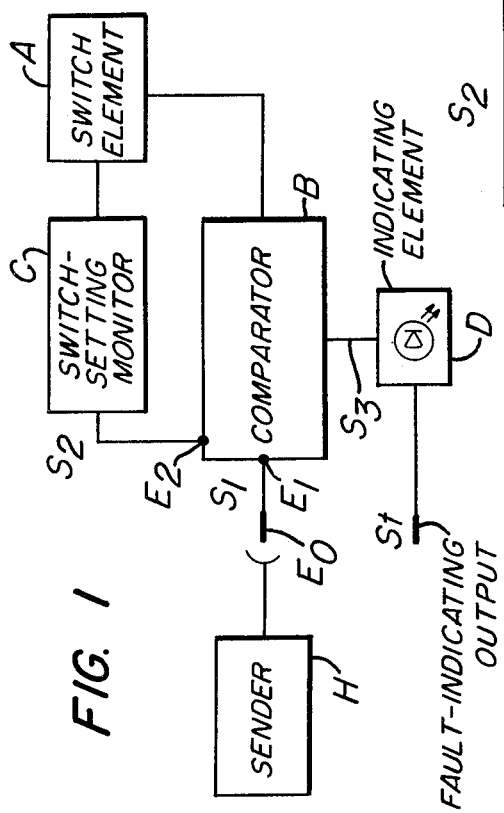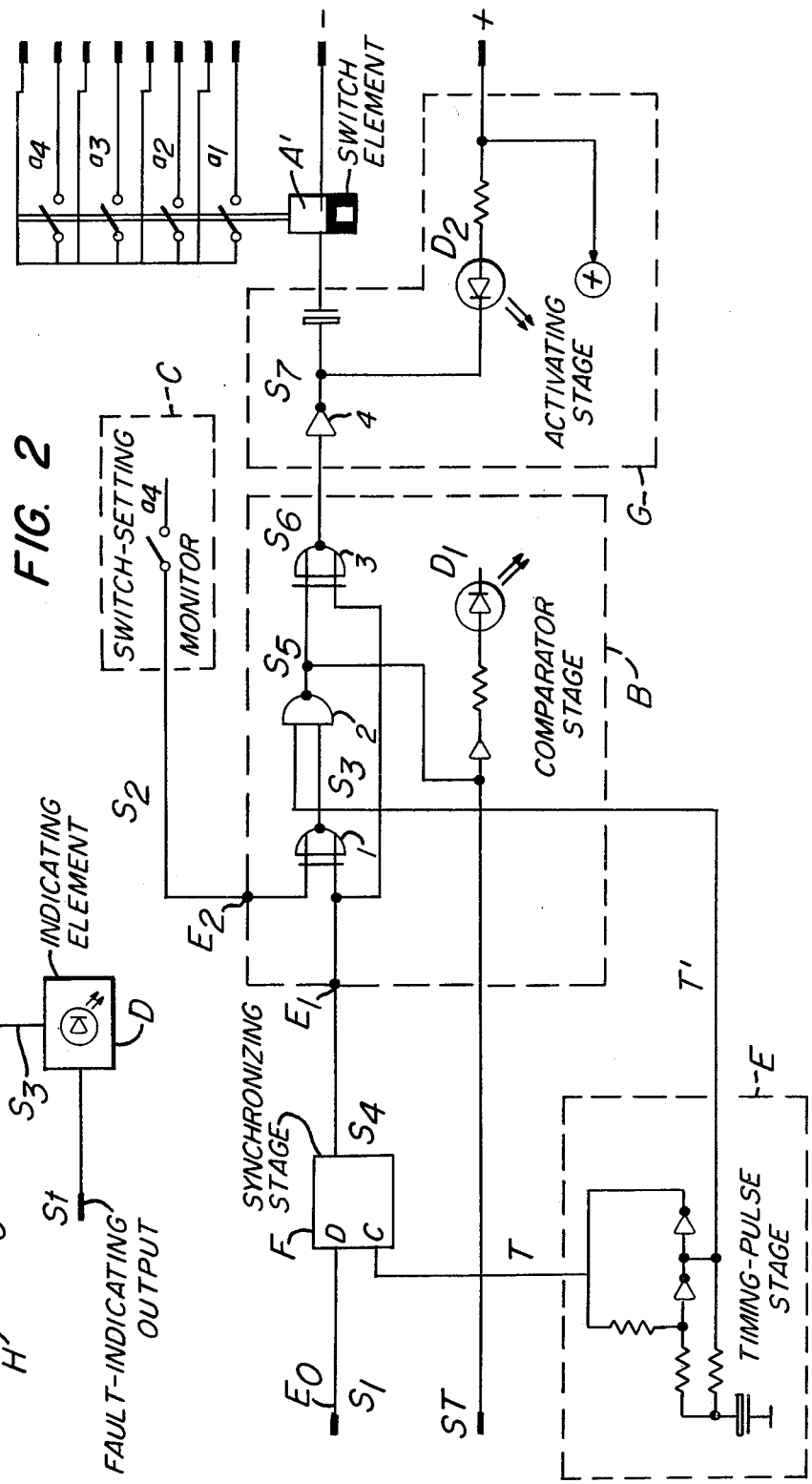

SWITCHING CIRCUIT FOR MONITORING THE SWITCHING STATE OF SWITCH ELEMENTS

The invention concerns a switching circuit for monitoring the switching-state of switch elements.

In control and regulating technology, it is known practice to incorporate electronic switching elements or electro-mechanical switching devices such as, for example, bistable relays, at the interface outputs of switching circuits. As the result of faults of an electrical or mechanical nature, it is possible for a switching state to be present which differs from that indicated by the control signal, and this can be extremely disadvantageous.

The basic task of the invention is to create a switching arrangement for monitoring the switching state of switch elements which, at low cost, ensures dependable monitoring of the switching state of switch elements. A switching arrangement of this type should, in addition, be capable of being used to monitor electromechanical switching devices.

This task is accomplished in accordance with the invention by the means described in the distinguishing features presented in claim 1. Additional advantageous embodiments will be evident from the sub-claims.

The advantages to be obtained by means of the invention reside, in particular, in the fact that it is possible, with simple means, to ensure dependable monitoring of the switching state of switch elements. As a result, it is possible, on the one hand, to detect the switching state of the switch element and signal the presence of a false switch setting and, on the other hand, bring the switch element into its correct switching position independently of the control signal.

An embodiment of the invention will be described in greater detail in the following and will be illustrated by the appended drawings in which:

FIG. 1 presents a block circuit diagram of the device made in accordance with the invention, for monitoring the switching states of switch elements and FIG. 2 presents a block circuit schematic diagram for monitoring the switching state of a bistable relay.

As may be seen from FIG. 1, the switching arrangement, shown in the form of a block circuit-diagram for controlling and monitoring the switching states of the electronic switch element A consists, in essence, of a sender H, a comparator stage B, a switch-setting monitoring stage C, an indicating element D, and a fault-indicating output St. A control signal $S_1$ produced by the sender (H) and applied to the control input $E_0$ arrives as an input signal at a first input $E_1$ of the comparator stage B and serves to activate the electronic switching element A. The existing switching stage of the switching element A is recognized by the switch-setting monitoring stage C and, as a result, a signal $S_2$ is produced corresponding to the switching state and is transmitted to a second input $E_2$ of the comparator stage B. As long as the signals $S_1$ and $S_2$ at the inputs $E_1$ and $E_2$ to the comparator stage have the same value, the switching state of the electronic switch element A indicated by the control signal $S_1$ is present. On the other hand, if, during the continuous monitoring operation, different signals $S_1$ and $S_2$ are applied to the inputs $E_1$ and $E_2$ of the comparator stage B, the said comparator stage produces a perturbation or fault signal $S_3$ which is displayed by the indicating element D and is transmitted as a fault signal St. The indicating element D can, for example, consist of a luminescent or light emitting diode.

Checking the switch-setting of the electronic switching element is effected via a signal level at the output to the switch element, namely by direct decision feedback of the signal.

The switch element to be monitored can also be conceived, quite generally, as a receiver which is made in the form of a movable switchable part. This can, for example, be a door, whereby an interrogation of the switching state is effected by an optical method, by means of a photoelectric device, or by an inductive method using a proximity switch.

FIG. 2 illustrates another preferred embodiment of the invention when it is required to monitor the then existing switching state of an electromechanical switch such as, for example, a bistable relay instead of a switching element.

For this case, the circuit arrangement is supplemented by three stages, namely by a timing-pulse stage E, a synchronizing stage F and an activating stage G.

The timing-pulse stage E produces the impulses T and T′ required to activate the electromechanical switch-element A′ (bistable relay) and to control both the comparator stage B and the synchronizing stage F.

The synchronizing stage F is required to synchronize the control signal $S_1$ at the control input $E_0$ with the timing signal T′ from the comparator stage B. The signal $S_4$ then emitted by the synchronizing stage only changes its state during the time in which no fault-signal St arises. Advantageously, this is achieved by a D-flip-flop which is not shown in the block circuit diagram in FIG. 2. In this case, the signal $S_4$ assumes the state of the signal $S_1$ existing at the time of the positive flank of the timing-signal T.

The activating stage G serves to activate the bistable relay A′. In the event of a perturbation or fault, switching impulses are released by the comparator stage B which bring the relay into the switching setting corresponding to the control signal $S_1$.

The switching circuit illustrated in FIG. 2 operates as follows:

The switching impulses required to activate the bistable relay and to control the comparator stage B and the synchronizing stage F are produced at specific time intervals by the clock-pulse generator E. The comparator stage B checks and continuously compares the switching state of the relay with the control signal $S_1$ which is applied to the control input $E_0$ and which arrives via the synchronizing stage F at the input $E_1$ of the comparator stage B.

The relay's switching state is given by the switch-setting monitoring stage C to the input $E_2$ of the comparator stage B. As long as the signals $S_4$ and $S_2$ have the same values at the inputs $E_1$ and $E_2$, there exists the switching state of the relay A indicated by the control signal $S_1$, so that, in the comparator stage B, the output signal $S_3$ from an EXOR (Exclusive-Or)-gate (anti-coincidence gate) 1 is equal to zero. As a result, a following NAND gate 2 for the timing signal T′ is blocked and the output signal corresponds to 1. The output signal $S_6$ from an EXOR-gate 3 following the NAND gate 2 is controlled directly by the signal $S_4$ applied to the input $E_1$. When in the monitoring phase, different signals are applied to the inputs $E_1$ and $E_2$ of the comparator stage, the signal $S_2 = 1$, so that the signal $S_5$ can change with the timing signal T′. The signal $S_5$ then serves to release a perturbation or fault signal which is also simultaneously indicated by the luminescent diode indicator $D_1$. In the event of a fault, the signal $S_6$ is controlled by the timing signal T' and, on the one hand, yields amplified switching signals $S_7$ via an amplifier 4 to the relay A' to be controlled, as a result of which the said relay A' is switched into the position corresponding to the control signal $S_1$, and, on the other hand, activates an indicating element $D_2$.

Monitoring of the switch-setting in the switch-setting monitoring stage C can be effected, advantageously, by a switch contact $a_4$ belonging to the bistable relay A'. Alternatively, detecting the switching state of an electromechanical switch contact for the switch-setting monitor stage can also be accomplished by optical switch closure detection, or inductive detection of the energization of the electromechanical switch.

Advantageously, both the switching arrangements shown in FIGS. 1 and 2 can be constructed either as a discrete circuit or as a hybrid circuit, whereby the latter is itself a component part of the switch element.

According to the provisions of the patent statutes, I have explained the principle of my invention and have illustrated and described what I now consider to represent its best embodiment. However, I desire to have it understood that, within the scope of the appended claims, the invention may be practiced otherwise than as specifically illustrated and described.

I claim:

1. A switching circuit for monitoring the switching state of switching elements, including a switching element responsive to a switch control signal connected thereto to switch from one switching state to another switching state, and a switch-setting monitor connected for recognizing the switching state of said switching element and accordingly producing a monitor signal which corresponds to the switching state, the improvement comprising:

(a) a timing stage for producing clock impulse signals for synchronously controlling a synchronizing stage and a comparator stage;

(b) a synchronizing stage connected to receive a timing signal from said timing stage and an input signal, and adapted to transmit said input signal upon receipt of said impulse signals;

(c) a comparator stage connected to receive clock impulse signals from said timing stage, the input signal transmitted from said synchronizing stage, and the monitor signal from said switch-setting monitor, and adapted to switch said switching element with and in response to said input signal and to compare said monitor signal and said input signal for producing a fault signal which is connected to said switching element to change the switching state when said monitor and input signals diversely indicate a fault in that said switching element is in different switching states.

2. The switching circuit of claim 1, wherein said comparator includes electronic gate means which feeds said fault signal to said switching element for actuation thereof instead of said input signal when said fault is detected.

3. The switching circuit of claim 2, wherein said fault signal is said clock impulse signals from said timing-pulse stage.

4. The switching circuit of claim 3, wherein said switching element is an electro-mechanical switch.

5. The switching circuit of claim 4, wherein said electro-mechanical switch is a bistable relay.

6. The switching circuit of claim 1, wherein said switch-setting monitor includes means to detect the presence of a signal level on the switched contact output of said switching element.

* * * * *